US007599240B2

(12) United States Patent
Shin et al.

(10) Patent No.: US 7,599,240 B2
(45) Date of Patent: Oct. 6, 2009

(54) INTERNAL VOLTAGE GENERATOR OF SEMICONDUCTOR MEMORY DEVICE

(75) Inventors: Yoon-Jae Shin, Kyoungki-do (KR); Jun-Gi Choi, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 160 days.

(21) Appl. No.: 11/822,005

(22) Filed: Jun. 29, 2007

(65) Prior Publication Data

US 2008/0080289 A1 Apr. 3, 2008

(30) Foreign Application Priority Data

Sep. 28, 2006 (KR) ............ 10-2006-0095170

(51) Int. Cl.
 *G11C 5/14* (2006.01)
(52) U.S. Cl. ............... 365/226; 365/227; 365/229
(58) Field of Classification Search .......... 365/226, 365/227, 229
 See application file for complete search history.

(56) References Cited

U.S. PATENT DOCUMENTS

| 5,396,113 | A | * | 3/1995 | Park et al. ............. 327/543 |
| 5,452,253 | A | * | 9/1995 | Choi ..................... 365/201 |
| 5,920,226 | A | * | 7/1999 | Mimura ................. 327/537 |
| 6,079,023 | A | | 6/2000 | Yoon et al. |
| 6,384,672 | B2 | * | 5/2002 | Oh ........................ 327/541 |
| 6,778,460 | B1 | | 8/2004 | Jung |
| 6,891,773 | B2 | | 5/2005 | Park |
| 7,049,881 | B2 | * | 5/2006 | Moon et al. ............ 327/541 |
| 7,173,480 | B2 | | 2/2007 | Kim et al. |
| 7,372,762 | B2 | * | 5/2008 | Lee ....................... 365/226 |
| 2007/0025163 | A1 | | 2/2007 | Partsch et al. |
| 2008/0001653 | A1 | * | 1/2008 | Lee et al. ............... 327/541 |

FOREIGN PATENT DOCUMENTS

| JP | 11-203876 | 7/1999 |
| KR | 10-2004-0110669 | 12/2004 |
| KR | 10-2005-0064692 | 6/2005 |
| KR | 10-2005-0079538 | 8/2005 |
| KR | 10-2006-0031027 | 4/2006 |

* cited by examiner

*Primary Examiner*—Tuan T Nguyen
*Assistant Examiner*—Hien N Nguyen
(74) *Attorney, Agent, or Firm*—Mannava & Kang, P.C.

(57) ABSTRACT

An internal voltage generator of a semiconductor memory device controls generating an internal voltage according to an increase of the internal voltage during an active mode, to thereby decrease current consumption. The internal voltage generator of a semiconductor memory device includes a voltage sensor, a plurality of first control units, a plurality of second control units, and a plurality of voltage drivers. The voltage sensor detects an internal voltage. The plurality of first control units generate a plurality of internal control signals according to the voltage level of an output of the voltage sensor. The plurality of second control units generate a plurality of driver control signals in response to the plurality of internal control signals. The plurality of voltage drivers are turned on/off in response to the plurality of driver control signals.

18 Claims, 7 Drawing Sheets

INTERNAL VOLTAGE GENERATOR OF SEMICONDUCTOR MEMORY DEVICE

CROSS-REFERENCE TO RELATED APPLICATIONS

The present invention claims priority of Korean patent application no. 10-2006-0095170, filed in the Korean Patent Office on Sep. 28, 2006, which is incorporated by reference in its entirety.

BACKGROUND OF THE INVENTION

The present invention relates to a semiconductor memory device; more particularly, to an internal voltage generator for use in the semiconductor memory device.

A dynamic random access memory (DRAM), which is a kind of semiconductor memory device, inputs and outputs data through following processes. If a row address strobe command is inputted to the DRAM, a word line corresponding to an input address is activated. Data stored in unit cells corresponding to the word line are transmitted to bit line pairs. The transmitted data is sensed and amplified by bit line sense amplifiers. Thereafter, when a column address strobe command is inputted to the DRAM, a column selecting signal is generated according to an input address and one bit line pair is selected by the column selecting signal. A data amplified in the selected bit line pair is outputted or replaced with an external input data according to a write enable command. And then, the bit line pair is precharged and initialized for a subsequent read or write operation.

During the above-mentioned processes, a period from an input timing of the row address strobe command to a beginning of a precharge operation is called a row active time tRAS. A minimum row active time tRASmin is a minimum time required to perform a read or write operation after the row address strobe command is input. That is, the minimum row active time tRASmin is a minimum time for bit line sense amplifiers to sense and amplify data stored in unit cells corresponding to a selected word line. The minimum row active time tRASmin should be guaranteed for the data not to be lost.

The bit line sense amplifiers amplify the data based on a core voltage VCORE. Thus a DRAM should prevent a level of core voltage VCORE from decreasing or fluctuating. However, after the minimum row active time tRASmin passes from the input timing of the row address strobe command, the core voltage VCORE is less used in the DRAM until the read or write operation is performed. Nevertheless, the DRAM operates active drivers supplying the core voltage VCORE during above-mentioned period in the same manner as other periods. As a result, current consumption increases.

FIG. 1 is a block diagram showing a conventional internal voltage generator. The internal voltage generator includes an initial voltage generator 10 for determining an initial condition of a core voltage VCORE, a standby mode voltage generator 11 for generating the core voltage VCORE, six active mode voltage generators 12 to 17 for generating the core voltage VCORE during an active operation and a controller 18 for controlling a half of active mode voltage generators 12 to 14.

The controller 18 controls the active mode voltage generators 12 to 14 in response to a write/read signal W/RSIG and an internal voltage active signal VINTACT. The internal voltage active signal VINTACT has been activated from an input timing of a row address strobe command until a minimum row active time tRASmin passes. The controller 18 includes a first NOR gate NOR1 and a first inverter INV1. The first NOR gate NOR1 receives the write/read signal W/RSIG and the internal voltage active signal VINTACT. The first inverter INV1 inverts an output of the first NOR gate NOR1 to output control signals.

Because the core voltage VCORE is more used during the active operation including read or write operation, the plurality of the active mode voltage generators 12 to 17 is additionally used during the active operation. The standby mode voltage generator 11 generates the core voltage VCORE during both the active operation and a precharge operation. All of the standby and active mode voltage generators 11 to 17 are supplied with an external reference voltage VREFC.

Three active mode voltage generators 15 to 17 are controlled by a boosted voltage active signal VPPACT. The boosted voltage active signal VPPACT is activated when a word line is selected by a row address and inactivated at the precharge operation. The boosted voltage active signal VPPACT is for supplying a boosted voltage to the word line.

FIG. 2 is a signal timing diagram showing an operation of the internal voltage generator described in FIG. 1.

Under the condition that the reference voltage VREFC is supplied to the standby and active mode voltage generators 11 to 17, the internal voltage active signal VINTACT and the boosted voltage active signal VPPACT are activated as a high level at an initial active operation. And the write/read signal W/RSIG has a low logic level until the write or read operation begin.

Accordingly, the controller 18 outputs the control signals as a high level and operates the active mode voltage generators 12 to 14. The active mode voltage generators 15 to 17 are enabled by the boosted voltage active signal VPPACT. All of the active mode voltage generators 12 to 17 operate at the initial active operation.

After a minimum row active time tRASmin passes, the internal voltage active signal VINTACT becomes in a low logic level. And the active mode voltage generators 12 to 14 stop operating for a period A described in FIG. 2. The active mode voltage generators 15 to 17 continue to operate because the boosted voltage active signal VPPACT maintains a high logic level.

Thereafter, when the write/read signal W/RSIG is activated, the controller 18 outputs the control signal having a high logic level. All of the active mode voltage generators 12 to 17 continue to operate until the precharge operation begins. When the boosted voltage active signal VPPACT and the write/read signal W/RSIG are inactivated in response to a precharge signal activated at the precharge operation, all of the active mode voltage generators 12 to 17 stop operating.

Accordingly, the internal voltage generator generates the core voltage VCORE only in response to the boosted voltage active signal VPPACT during the period A. The internal voltage generator enables the active mode voltage generators 15 to 17 without respect to the level of core voltage VCORE, thereby to generate a constant voltage. However, when the level of core voltage VCORE is higher than the reference voltage VREFC, it is efficient to enable less active mode voltage generators to decrease current consumption. The conventional internal voltage generator cannot appropriately deal with the variation of the core voltage VCORE.

SUMMARY OF THE INVENTION

Embodiments of the present invention are directed to provide an internal voltage generator of a semiconductor memory device for controlling the generation of an internal voltage according to an increase of the internal voltage during an active mode, thereby decreasing current consumption.

In accordance with an aspect of the present invention, an internal voltage generator of a semiconductor memory device includes a voltage sensor for detecting an internal voltage, a plurality of first control units for generating a plurality of internal control signals according to the voltage level of an output of the voltage sensor, a plurality of second control units for generating a plurality of driver control signals in response to the plurality of internal control signals, and a plurality of voltage drivers turned on/off in response to the plurality of driver control signals, wherein the each first control unit has its own logic threshold voltage.

In accordance with an another aspect of the present invention, a semiconductor memory device includes a plurality of voltage drivers partitioned into two groups for generating an internal voltage, a first controller for enabling a first group of voltage drivers for the minimum time and from an input timing of an internal write/read command to an input timing of an internal precharge command, and a second controller for enabling a second group of voltage drivers and controlling the number of enabled voltage drivers according to the level of the internal voltage from the end of the minimum time to the input timing of the internal write/read command. After a minimum time for a bit line sense amplifier to amplify data passes from an input timing of a row address strobe command, a write/read operation is performed by the internal write/read command and then a precharge operation is performed by the internal precharge command.

In accordance with a further aspect of the present invention, a semiconductor memory device includes a voltage sensor for detecting an internal voltage, a plurality of first control units for generating a plurality of internal control signals according to the voltage level of an output of the voltage sensor, and a plurality of voltage drivers turned on/off in response to the plurality of internal control signals, wherein the each first control unit has its own logic threshold voltage.

DESCRIPTION OF SPECIFIC EMBODIMENTS

In accordance with the present invention, an internal voltage generator senses an internal voltage and selectively operates a plurality of voltage generators according to the sensed internal voltage to reduce current consumption. A semiconductor memory device including the internal voltage generator according to the present invention can be effectively used in a low power system such as a mobile device.

Hereinafter, a semiconductor memory device in accordance with the present invention will be described in detail referring to the accompanying drawings.

Figure 3:
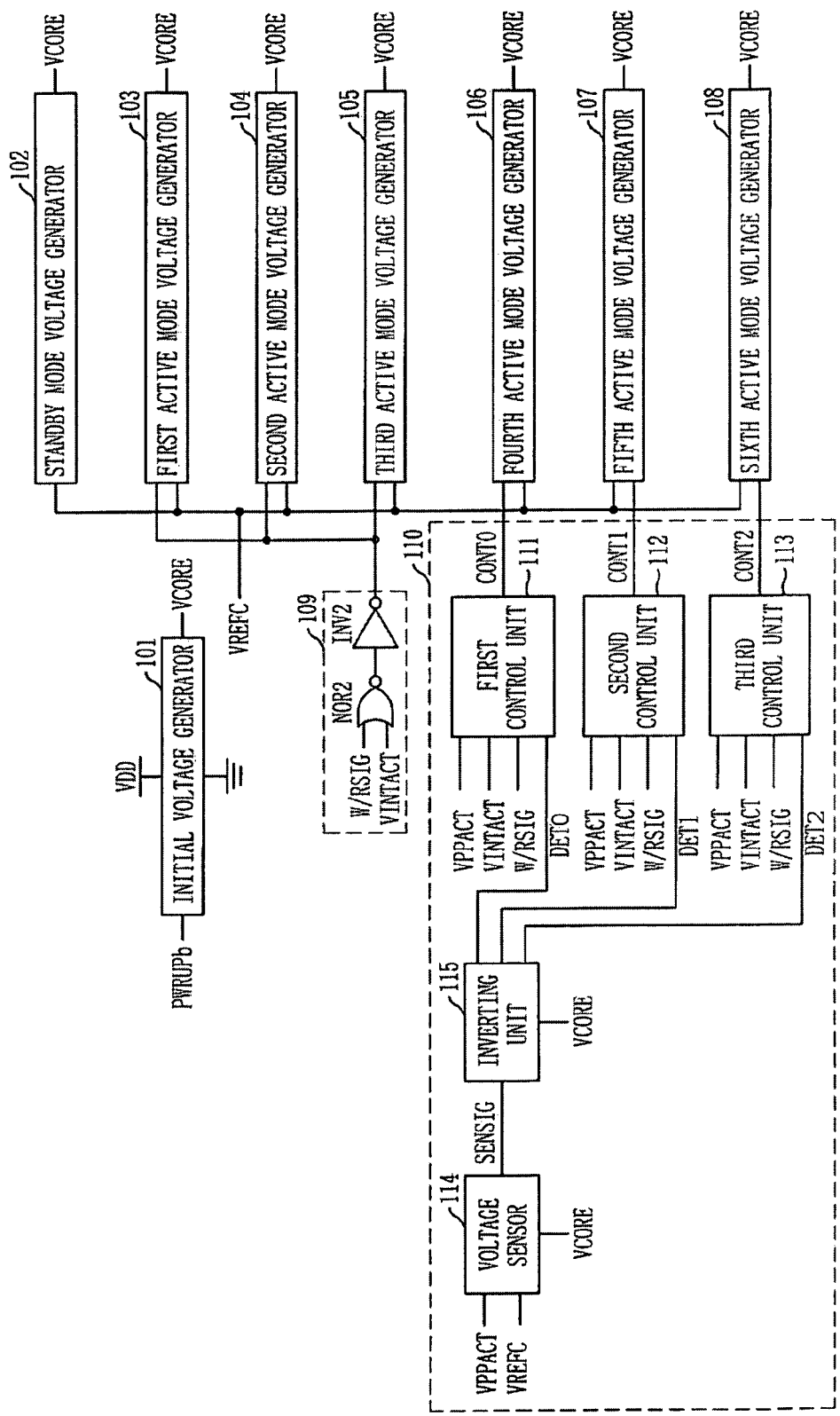
FIG. 3 is a block diagram showing an internal voltage generator in accordance with the present invention.

FIG. 3 is a block diagram showing an internal voltage generator in accordance with the present invention. The internal voltage generator includes an initial voltage generator 101, a standby mode voltage generator 102, six active mode voltage generators 103 to 108, a first controller 109 and a second controller 110.

The initial voltage generator 101 determines an initial condition of a core voltage VCORE. The standby mode voltage generator 102 generates the core voltage VCORE. The six active mode voltage generators 103 to 108 generate the core voltage VCORE during an active operation. The first controller 109 controls three active mode voltage generators 103 to 105 in response to a write/read signal W/RSIG and an internal voltage active signal VINTACT. The second controller 110 selectively controls three active mode voltage generators 106 to 108 based on a result of sensing the level of core voltage VCORE.

The first controller 109 includes a first NOR gate NOR2 and a first inverter INV2. The first NOR gate NOR2 receives the write/read signal W/RSIG and the internal voltage active signal VINTACT. The first inverter INV2 inverts an output of the first NOR gate NOR2 to output control signals.

Because the core voltage VCORE is more used during the active operation including read or write operation, the plurality of the active mode voltage generators 103 to 108 is additionally used during the active operation. The standby mode voltage generator 102 generates the core voltage VCORE during both the active operation and a precharge operation. All of the standby and active mode voltage generators 102 to 108 are supplied with an external reference voltage VREFC.

The second controller 110 includes a voltage sensor 114, an inverting unit 115 and control units 111 to 113. The voltage sensor 114, enabled by a boosted voltage active signal VPPACT, detects the level of the core voltage VCORE. The inverting unit 115 receives an output of the voltage sensor 114 to output detecting signals DET0 to DET2. The control units 111 to 113 output control signals CONT0 to CONT2 for controlling the active mode voltage generators 106 to 108 in response to the detecting signals DET0 to DET2, the boosted voltage active signal VPPACT, and the internal voltage active signal VINTACT. The boosted voltage active signal VPPACT is activated when a word line is selected by a row address and is inactivated at the precharge operation. The boosted voltage active signal VPPACT is for supplying a boosted voltage to the word line. And the internal voltage active signal VINTACT has been activated from an input timing of a row address strobe command until a minimum row active time tRASmin passes.

Figure 4:
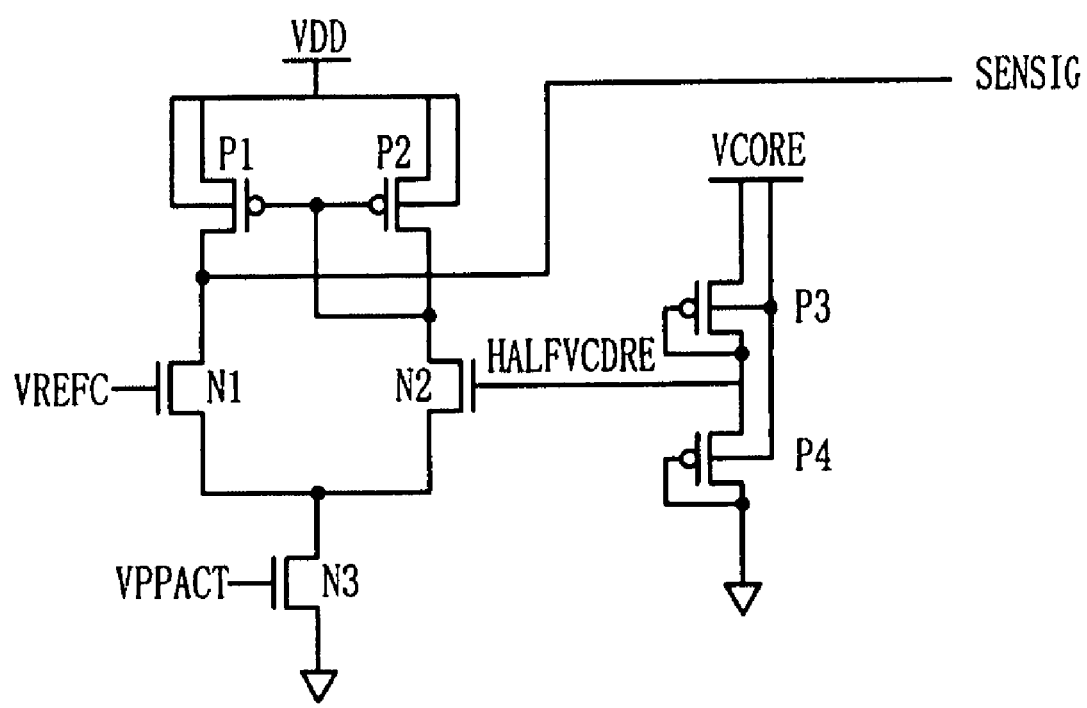
FIG. 4 is a schematic circuit diagram showing a voltage sensor described in FIG. 3.

FIG. 4 is a schematic circuit diagram showing the voltage sensor 114 described in FIG. 3. The voltage sensor 114 includes PMOS transistors P1 to P4 and NMOS transistors N1 and N2.

The third and fourth PMOS transistors P3 and P4 divide the core voltage VCORE to generate a half core voltage HALFVCORE. The voltage sensor 114 compares the half core voltage HALFVCORE with the reference voltage VREFC by using a differential amplifier. The differential amplifier is embodied by the PMOS transistors P1 and P2 and the NMOS transistors N1 to N3. The third NMOS transistor N3 connected to a ground voltage VSS receives the boosted voltage active signal VPPACT through its gate. Two PMOS transistors P1 and P2 connected to a supply voltage VDD constitute a current mirror. Two NMOS transistors N1 and N2 connected between the current mirror and the third NMOS transistor N3 receive the reference voltage VREFC and the half core voltage HALFVCORE through a gate, respectively. A comparison result is outputted to the inverting unit 115

Figure 5:
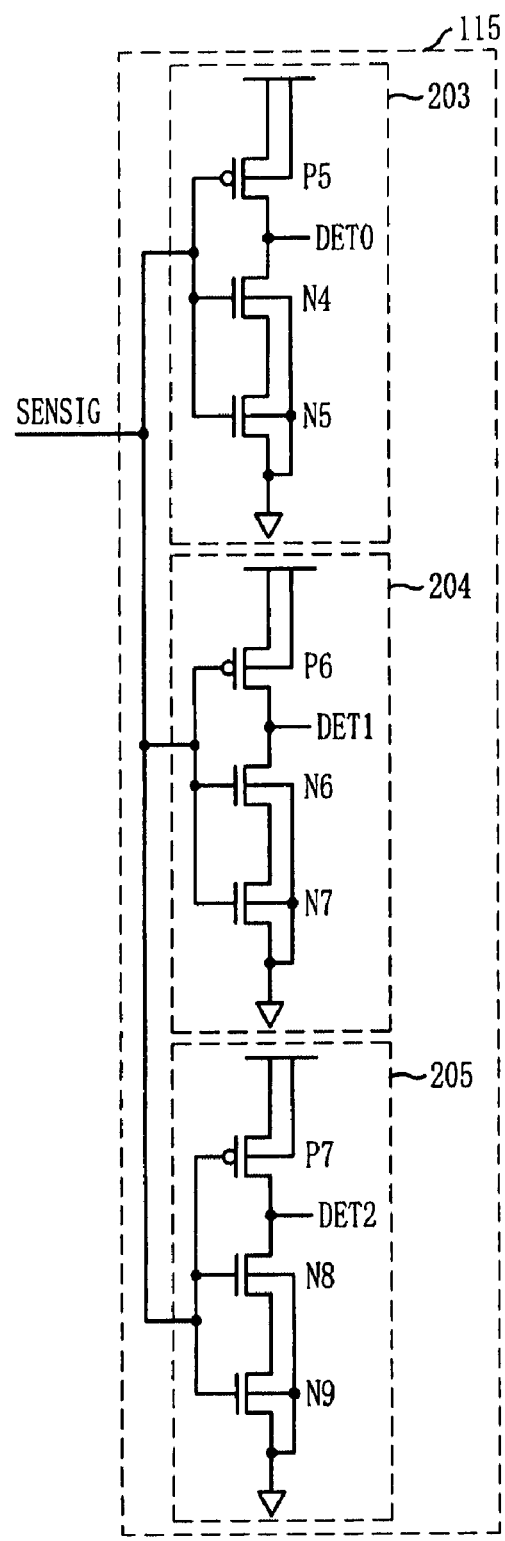
FIG. 5 is a schematic circuit diagram showing an inverting unit described in FIG. 3.

FIG. 5 is a schematic circuit diagram showing the inverting unit 115 described in FIG. 3. The inverting unit 115 includes three inverting circuits 203 to 205. More inverting circuits may be included in the inverting unit 115.

The first inverting circuit 203 includes a fifth PMOS transistor P5 and fourth and fifth NMOS transistors N4 and N5 for receiving an output signal SENSIG of the voltage sensor 114 through a gate. The second inverting circuit 204 includes a sixth PMOS transistor P6 and sixth and seventh NMOS transistors N6 and N7 for receiving the output signal SENSIG of the voltage sensor 114 through a gate. The third inverting circuit 205 includes a seventh PMOS transistor P7 and eighth and ninth NMOS transistors N8 and N9 for receiving the output signal SENSIG of the voltage sensor 114 through a gate.

Because the NMOS transistors N4 to N9 have a characteristic different from each other, a logic threshold voltage of each inverting circuit is controlled to be different.

When the core voltage VCORE decreases, the half core voltage HALFVCORE also decreases. Accordingly the output signal SENSIG of the voltage sensor 114 becomes a low logic level. Because all of the PMOS transistors P5 to P7 having an identical threshold voltage turn on in response to the output signal SENSING having the low logic level, the detecting signals DET0 to DET2 are outputted in a high logic level.

On the other hand, the half core voltage HALFVCORE increases according to an ascent of the core voltage VCORE. The output signal SENSIG of the voltage sensor 114 becomes a high logic level. According to how much the core voltage VCORE increases, the inverting circuits 203 to 205 output three detecting signals DET0 to DET2, each having in a low or high logic level.

The high logic level of the output signal SENSIG is different according to the ascent amount of the core voltage VCORE. Because the NMOS transistors N4 to N9 have a logic threshold voltage different from each other, the NMOS transistors N4 to N9 selectively turn on according to the ascent amount of the core voltage VCORE. The detecting signals DET0 to DET2 become a low logic level or a high logic level.

Figure 6:
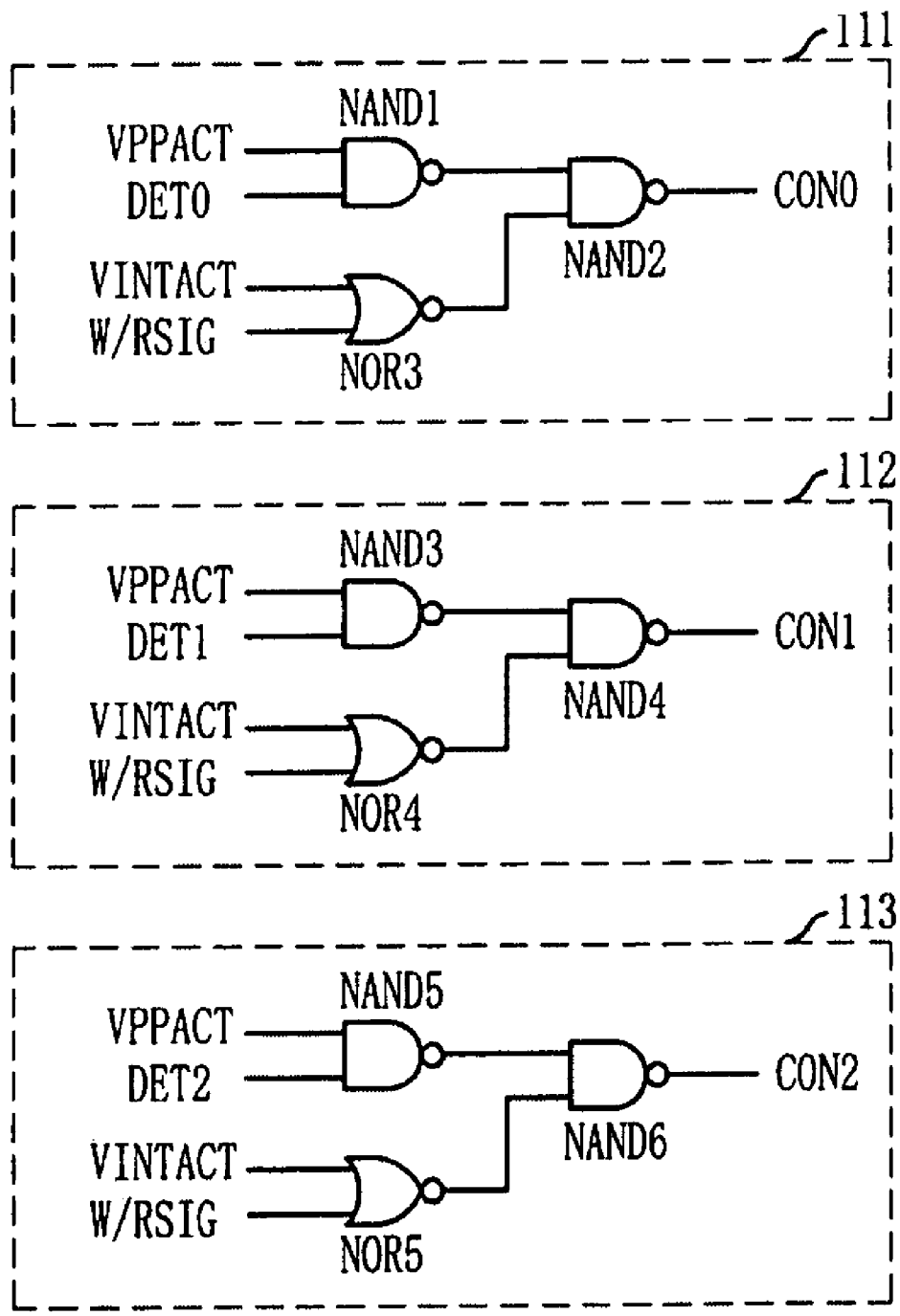
FIG. 6 is a schematic circuit diagram showing control units described in FIG. 3.

FIG. 6 is a schematic circuit diagram showing the control units 111 to 113 described in FIG. 3.

The first control unit 111 controls the fourth active mode voltage generator 106 according to the first detecting signal DET0. The first control unit 111 includes first and second NAND gates NAND1 and NAND2 and a second NOR gate NOR3. The first NAND gate NAND1 performs a logic NAND operation to the boosted voltage active signal VPPACT and the first detecting signal DET0. The second NOR gate NOR3 performs a logic NOR operation to the internal voltage active signal VINTACT and the write/read signal W/RSIG. The second NAND gate NAND2 performs a logic NAND operation to outputs of the first NAND gate NAND1 and the second NOR gate NOR3 to thereby output the first control signal CONT0.

The second control unit 112 controls the fifth active mode voltage generator 107 according to the second detecting signal DET1. The second control unit 112 includes third and fourth NAND gates NAND3 and NAND4 and a third NOR gate NOR4. The third NAND gate NAND3 performs a logic NAND operation to the boosted voltage active signal VPPACT and the second detecting signal DET1. The third NOR gate NOR4 performs a logic NOR operation to the internal voltage active signal VINTACT and the write/read signal W/RSIG. The fourth NAND gate NAND4 performs a logic NAND operation to outputs of the third NAND gate NAND3 and the third NOR gate NOR4 to thereby output the second control signal CONT1.

The third control unit 113 controls the sixth active mode voltage generator 108 according to the third detecting signal DET2. The third control unit 113 includes fifth and sixth NAND gates NAND5 and NAND6 and a fourth NOR gate NOR5. The fifth NAND gate NAND5 performs a NAND operation to the boosted voltage active signal VPPACT and the third detecting signal DET2. The fourth NOR gate NOR5 performs a NOR operation to the internal voltage active signal VINTACT and the write/read signal W/RSIG. The sixth NAND gate NAND6 performs a NAND operation to outputs of the fifth NAND gate NAND5 and the fourth NOR gate NOR5 to thereby output the third control signal CONT2.

When the core voltage VCORE is higher than a reference voltage, the first inverting circuit 203 of the inverting circuits 203 to 205 outputs the detecting signal DET0 having a low logic level. The other inverting circuits 204 and 205 output the detecting signals DET1 and DET2 having a high logic level. Accordingly, the control units 111 to 113 output the first control signal CONT0 having a low logic level and the second and third control signals CONT1 and CONT2 having a high logic level. In response to the control signals CONT0 to CONT2, the fourth active mode voltage generator 106 does not operate, but the fifth and sixth active mode voltage generators 107 and 108 operate.

Figure 1:
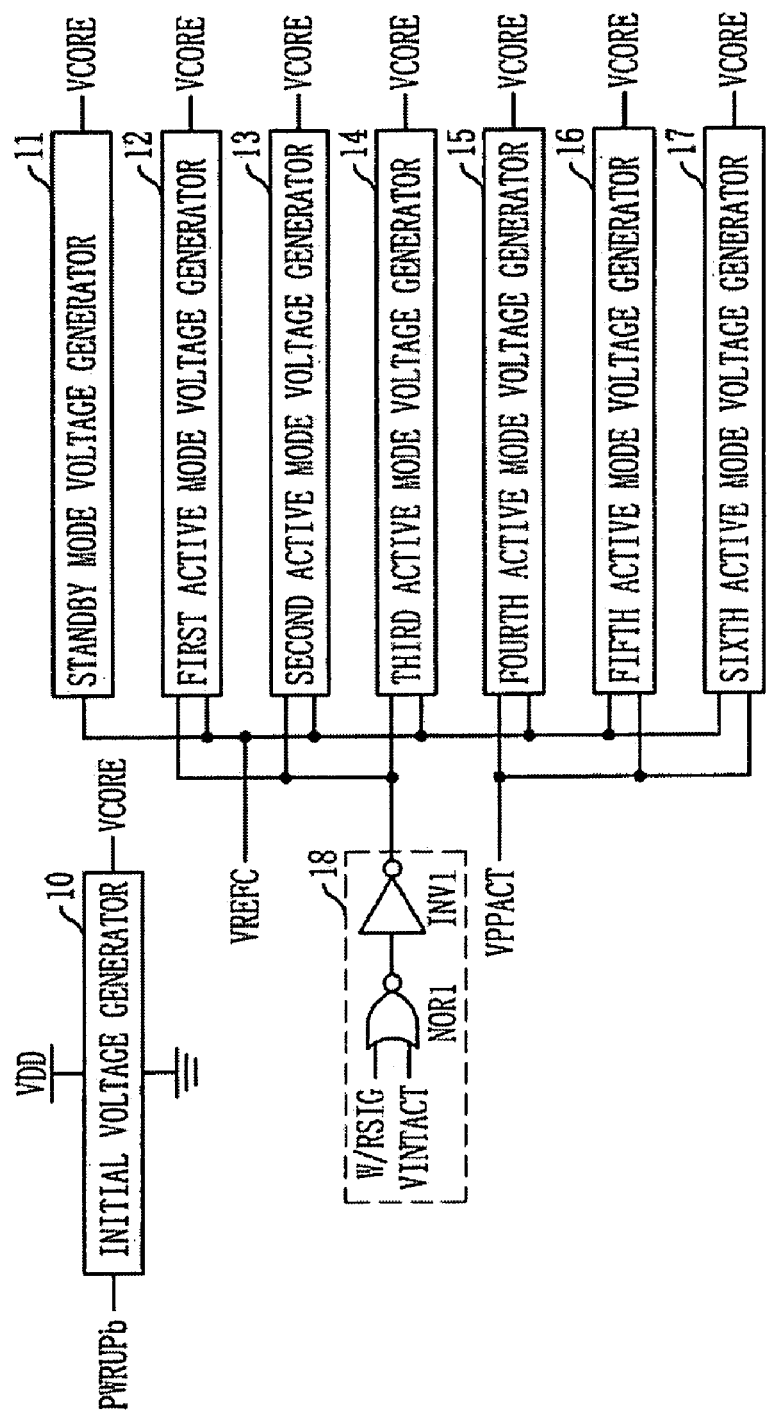
FIG. 1 is a block diagram showing a conventional internal voltage generator.
Figure 2:
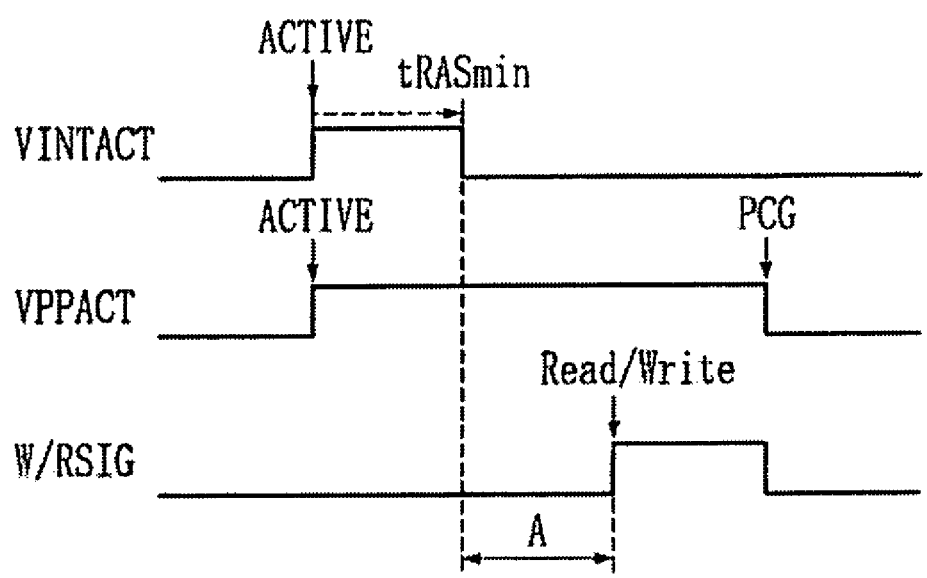
FIG. 2 is a signal timing diagram showing an operation of the internal voltage generator described in FIG. 1.

Referring to FIG. 2, an operation of the internal voltage generator in accordance with the present invention described below. During the period A, the reference voltage VREFC is supplied to the voltage sensor 114 and the standby and active mode voltage generators 102 to 108. The internal voltage active signal VINTACT and the write/read signal W/RSIG are activated in a low logic level and the boosted voltage active signal VPPACT is activated in a high level. Accordingly, the first controller 109 prevents three active mode voltage generators 103 to 105 from operating.

Meanwhile, the voltage sensor 114 is operated in response to the boosted voltage active signal VPPACT. The three detecting signals DET0 to DET2 are outputted according to the level of the core voltage VCORE.

When the core voltage VCORE decreases, all of three active mode voltage generators 106 to 108 should operate to recover the core voltage VCORE. The detecting signals DET0 to DET2 are outputted in a high logic level regardless of descent amount of the core voltage VCORE.

However, when core voltage VCORE increases, three active mode voltage generators 106 to 108 selectively generate the core voltage VCORE to decrease current consumption. According to the above description, assuming when the core voltage VCORE is a little higher than the reference voltage, the first detecting signal DET0 is outputted in a low logic level. The other detecting signals DET1 and DET2 are outputted in a high logic level. Accordingly, the fourth active mode voltage generator 106 does not operate, but the fifth and sixth active mode voltage generators 107 and 108 operate.

Figure 7:
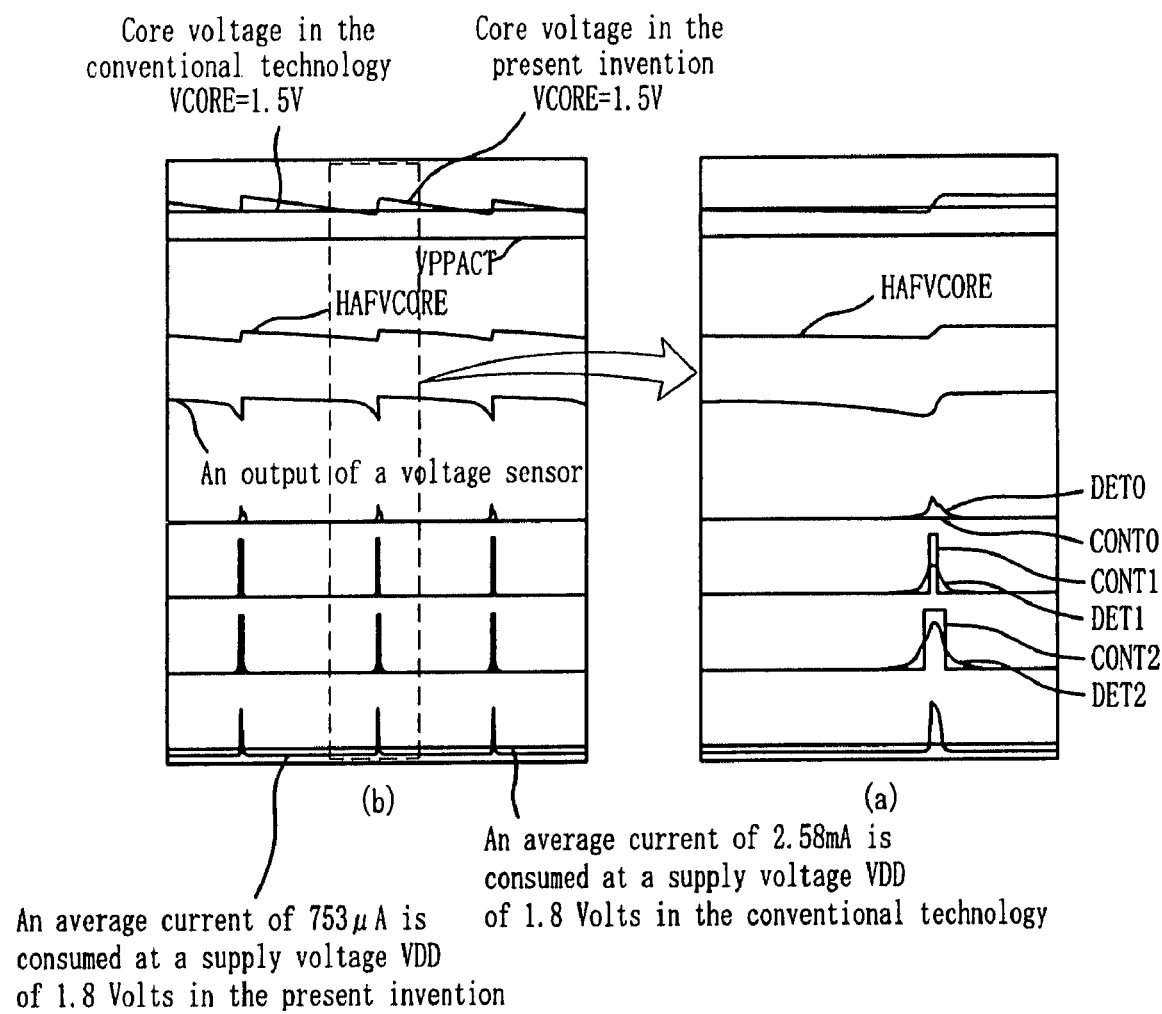
FIG. 7 is a simulation graph depicting an operation of the internal voltage generator described in FIG. 3.

FIG. 7 is a simulation graph depicting the operation of the internal voltage generator described in FIG. 3. It is simulated under a condition to a temperature of 25 degrees Celsius, a supply voltage VDD of 1.8 Volts and a reference voltage VREFC of 0.75 Volts.

Referring to FIG. 7(a), a half core voltage HALFVCORE corresponding to a core voltage VCORE increases. Because ascent amount is not much, only first detecting signal DET0 is outputted in a low logic level. The second and third detecting signals DET1 and DET2 are outputted in a high logic level.

In response to the detecting signals DET0 to DET2, the first control signal CONT0 is activated in a low logic level and the second and third control signals CON1 and CON2 is activated in a high logic level. Accordingly the fourth active mode voltage generator 106 does not operate and the fifth and sixth active mode voltage generators 107 and 108 operate.

Referring to FIG. 7(b), a conventional internal voltage generator generates a constant level of core voltage when a half core voltage HALFVCORE corresponding to a core voltage VCORE swings. However, an internal voltage generator of the present invention generates the core voltage VCORE according to the half core voltage HALFVCORE.

The internal voltage generator of the present invention selectively operates a plurality of voltage generators when the core voltage is higher than a reference voltage. When the core voltage is lower than the reference voltage, the internal voltage generator operates all voltage generators in order to maintain the core voltage to a reference voltage level.

Referring to FIG. 7(b), in the conventional internal voltage generator, an average current of 2.58 mA is consumed. However, the internal voltage generator according to an embodiment of the present invention consumes an average current of 756 uA.

When the core voltage VCORE is higher than the reference voltage VREFC, it is no longer required to charge the core voltage VCORE. Accordingly, a semiconductor memory device of the present invention decreases the number of voltage generators for generating the core voltage VCORE. The number of voltage generators turned on is determined according to the level of the core voltage VCORE. The higher the level of the core voltage VCORE, the smaller the number of voltage generators turned on. Current consumption of the semiconductor memory device including the internal voltage generator can decrease.

In the above particular embodiments, logic circuits are designed in the case that all input and output signals are activated at a high logic level. If an activation level of the signals changes, embodiments of the logic circuits should be also changed. Various embodiments may be made according to the subject matter of the present invention.

In addition, the PMOS transistors P5 to P7 of the inverting unit 115 can be changed to have a characteristic different to each other similarly with the NMOS transistors N4 to N9. According to descent amount of the core voltage VCORE, the active mode voltage generators 106 to 108 can turn on/off selectively.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator of a semiconductor memory device, comprising:
   a voltage sensor for detecting an internal voltage;
   a plurality of first control units for generating a plurality of internal control signals according to the voltage level of an output of the voltage sensor;
   a plurality of second control units for generating a plurality of control signals in response to the plurality of internal control signals; and
   a plurality of voltage generators turned on/off in response to the plurality of control signals, wherein each of the plurality of first control units has its own logic threshold voltage.

2. The internal voltage generator of claim 1, wherein the number of the plurality of voltage generators turned on is determined according to the level of the internal voltage.

3. The internal voltage generator of claim 2, wherein the voltage sensor includes:
   a voltage divider for dividing the internal voltage and generating a feedback voltage; and
   an amplifier for comparing the feedback voltage with a reference voltage and outputting a comparing result.

4. The internal voltage generator of claim 2, wherein the plurality of first control units include an inverting unit for receiving the output of the voltage sensor respectively.

5. The internal voltage generator of claim 2, wherein the plurality of second control units generate the plurality of control signals in response to the plurality of internal control signals and internal commands.

6. A semiconductor memory device wherein after a minimum time for a bit line sense amplifier to amplify data passes from an input timing of a row address strobe command, a write/read operation is performed by an internal write/read command and then a precharge operation is performed by an internal precharge command, comprising:
   a plurality of voltage generators partitioned into two groups for generating an internal voltage;
   a first controller for enabling a first group of voltage generators for the minimum time and from an input timing of the internal write/read command to an input timing of the internal precharge command; and
   a second controller for enabling a second group of voltage generators and controlling the number of enabled voltage generators according to the level of the internal voltage from the end of the minimum time to the input timing of the internal write/read command.

7. The semiconductor memory device of claim 6, wherein the second controller includes:
   a voltage sensor for detecting the internal voltage;
   a plurality of first control units for generating a plurality of internal control signals according to the voltage level of an output of the voltage sensor; and
   a plurality of second control units for generating a plurality of control signals in response to the plurality of internal control signals and internal commands,
   wherein the each first control unit has its own logic threshold voltage.

8. The semiconductor memory device of claim 6, further comprising:
   a standby mode voltage generator enabled in an active operation and the precharge operation for generating the internal voltage; and
   an initial voltage generator for determining initial level of the internal voltage.

9. The semiconductor memory device of claim 6, wherein the number of the second group of voltage generators turned on is determined according to the level of the internal voltage.

10. The semiconductor memory device of claim 7, wherein the voltage sensor includes:
    a voltage divider for dividing the internal voltage and generating a feedback voltage; and
    an amplifier for comparing the feedback voltage with a reference voltage and outputting a comparing result.

11. The semiconductor memory device of claim 10, wherein the plurality of first control units include an inverting unit for receiving the output of the voltage sensor respectively.

12. The semiconductor memory device of claim 6, wherein the first controller enables the first group of voltage generators in response to the internal write/read command and internal commands.

13. A semiconductor memory device, comprising:
    a voltage sensor for detecting an internal voltage;

a plurality of first control units for generating a plurality of internal control signals according to the voltage level of an output of the voltage sensor; and a plurality of voltage generators turned on/off in response to the plurality of internal control signals, wherein the each first control unit has its own logic threshold voltage.

14. The semiconductor memory device of claim 13, further comprising a plurality of second control units for generating a plurality of control signals in response to the plurality of internal control signals, in order to control the plurality of voltage generators.

15. The semiconductor memory device of claim 13, wherein the number of the plurality of voltage generators turned on is determined according to the level of the internal voltage.

16. The semiconductor memory device of claim 15, wherein the voltage sensor includes:

a voltage divider for dividing the internal voltage and generating a feedback voltage; and an amplifier for comparing the feedback voltage with a reference voltage and outputting a comparing result.

17. The semiconductor memory device of claim 15, wherein the plurality of first control units include an inverting unit for receiving the output of the voltage sensor respectively.

18. The semiconductor memory device of claim 14, wherein the plurality of second control units generate the plurality of control signals in response to the plurality of internal control signals and internal commands.

* * * * *